United States Patent [19]

Birchler

[11] Patent Number: 5,287,387
[45] Date of Patent: Feb. 15, 1994

[54] LOW SPLATTER PEAK-TO-AVERAGE SIGNAL REDUCTION

[75] Inventor: Mark A. Birchler, Roselle, Ill.

[73] Assignee: Motorola, Inc., Schaumburg, Ill.

[21] Appl. No.: 847,535

[22] Filed: Mar. 6, 1992

[51] Int. Cl.$^5$ .................................. H04L 25/49
[52] U.S. Cl. ........................ 375/60; 332/159
[58] Field of Search ............ 375/59, 60; 332/159, 332/123

[56] References Cited

U.S. PATENT DOCUMENTS

| | | | |
|---|---|---|---|
| 4,775,995 | 10/1988 | Chapman et al. | 332/103 |
| 5,021,753 | 6/1991 | Chapman | 379/58 |
| 5,048,054 | 9/1991 | Eyuboglu et al. | 375/10 X |
| 5,068,874 | 11/1991 | Leitch | 375/60 |

Primary Examiner—Stephen Chin
Assistant Examiner—Tesfaldet Bocure
Attorney, Agent, or Firm—Susan L. Lukasik; Steven G. Parmelee

[57] ABSTRACT

In order to maintain low-splatter in a peak-to-average reduction for a linear communication system, a method of windowed-clipping is used. When a sample of input signal is determined to be above a predetermined threshold, a signal peak is found and an attenuating window is centered at the peak. The attenuating window is applied to the input signal.

15 Claims, 2 Drawing Sheets

LOW SPLATTER PEAK-TO-AVERAGE SIGNAL REDUCTION

FIELD OF THE INVENTION

This invention relates to clipping of signals transmitted on radio frequencies (RF), including but not limited to clipping with low RF splatter.

BACKGROUND OF THE INVENTION

In a linear radio communication system, the peak-to-average ratio (i.e., the ratio of the signal envelope to the average power of the signal) of a communication signal is of critical importance to the cost, complexity, and size of the radio's linear power amplification system. Seemingly small reductions in peak-to-average ratio can have a significant impact on each of the above-mentioned system characteristics. This is especially true for systems that require high output power, such as a base station.

A problem in the design of linear power amplifiers is the effect of the transmitted signal's peak-to-average ratio on performance. As the peak-to-average ratio (PAR) increases, the attenuation needed for adequate splatter performance of the power amplifier increases proportionally. Therefore, it is highly desirable to control the PAR of the signal input to the amplifier. However, any attempt to reduce the nominal PAR through other than linear processing functions (i.e., non-linear signal processing) generates splatter. Splatter, which is signal energy that extends beyond the frequency band allocated to a signal, is highly undesirable because it interferes with communications on adjacent channels.

One method of reducing PAR is hard clipping, which reduces each signal value exceeding a clip threshold to a predetermined magnitude, often the threshold magnitude. Hard-clipping causes significant splatter due to the abrupt nature of its operation.

Another method of reducing PAR is a "soft" algorithm that applies the desired signal to a non-linear device that limits signal peaks. A significant proportion of the input samples must be altered, causing significant energy to be splattered into adjacent channels.

Therefore, a method of effective peak-to-average ratio control without the generation of significant splatter is desired.

DESCRIPTION OF A PREFERRED EMBODIMENT

The following describes an apparatus for and method of effective PAR control without the generation of significant splatter. The method involves a windowed-clipping algorithm that provides a low-splatter mechanism of reducing signal peaks by applying an attenuating window, such as an inverse Hanning window, to a limited number of signal samples centered at the peak of a signal above a clip threshold.

Figure 1:
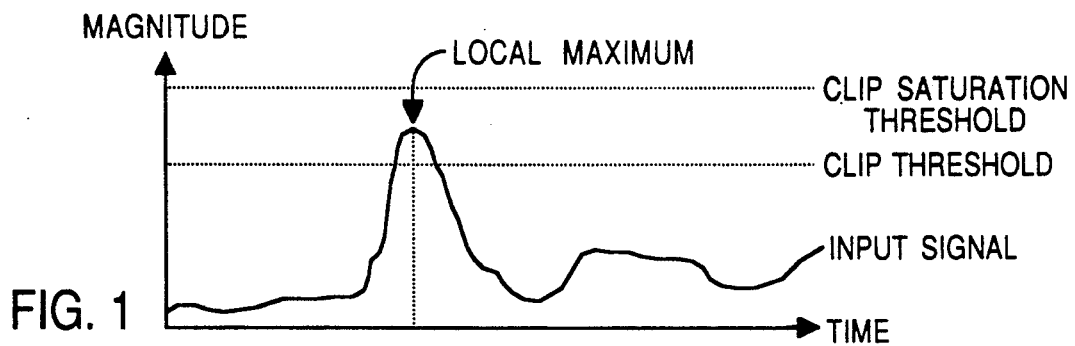
FIG. 1 is a timing diagram of an input signal in accordance with the invention.
Figure 2:
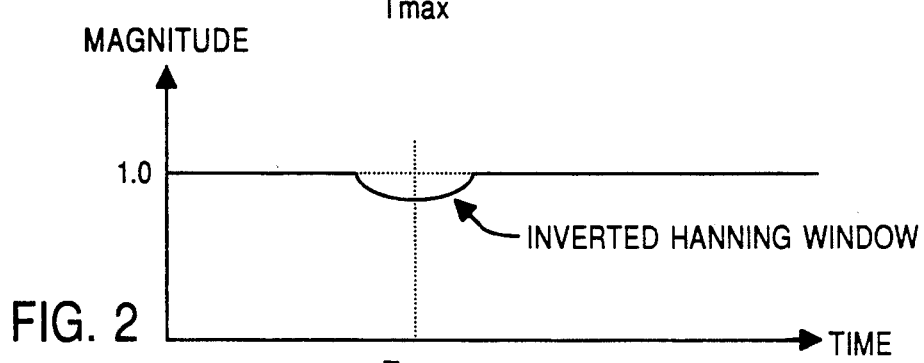
FIG. 2 is a timing diagram of an inverted Hanning window in according with the invention.
Figure 3:
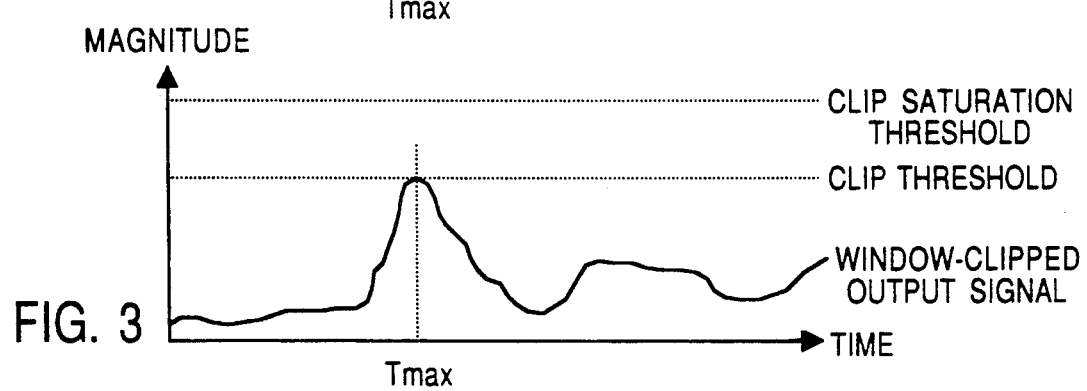
FIG. 3 is a timing diagram of the input signal of FIG. 1 after windowed clipping is performed in accordance with the invention.

A timing diagram of an input signal having a local maximum at time Tmax above a predetermined clip threshold is shown in FIG. 1. Because any signal value above the clip threshold causes a power amplifier to operate in its non-linear region, resulting in splatter, the a maximum signal input to the power amplifier is clipped to the clip threshold. A timing diagram of an inverted Hanning window centered at time Tmax, the time of the local maximum of the input signal, is shown in FIG. 2. After applying the inverted Hanning window to the input signal, the resultant signal is shown in the timing diagram of FIG. 3. Note that the signal values above the clip threshold have been attenuated to be no larger than the clip threshold, thus preventing the power amplifier from entering non-linear operation and causing splatter. This process will be referred to as windowed clipping or the windowed-clipping algorithm in this application.

Figure 4:
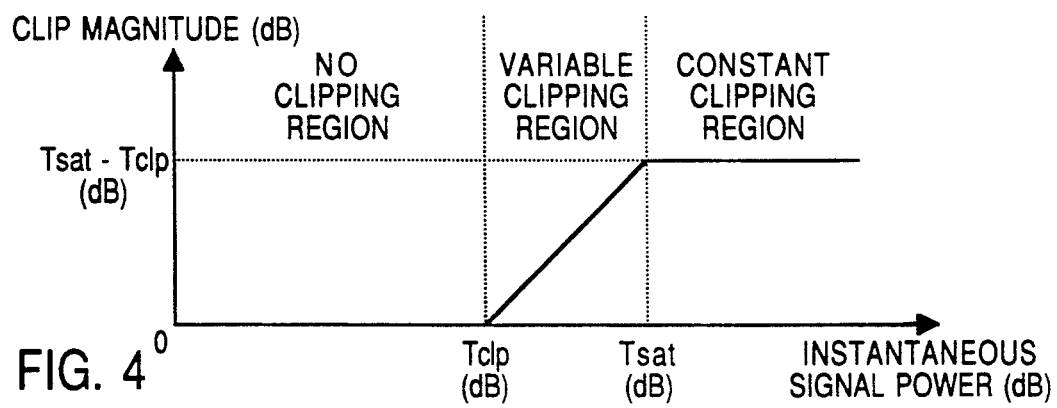
FIG. 4 is a diagram of clip magnitude versus instantaneous signal power in accordance with the invention.

A diagram of clip magnitude versus instantaneous signal power is shown in FIG. 4. No clipping occurs when the instantaneous signal power is below Tclp, where Tclp is the predetermined clip threshold power level as well as the maximum allowed peak signal power value that does not trigger the windowed-clipping algorithm. Variable clipping occurs when the instantaneous signal power is above Tclp and below Tsat, the predetermined clip saturation threshold power level. Constant clipping occurs when the instantaneous signal power is above Tsat.

Figure 5:
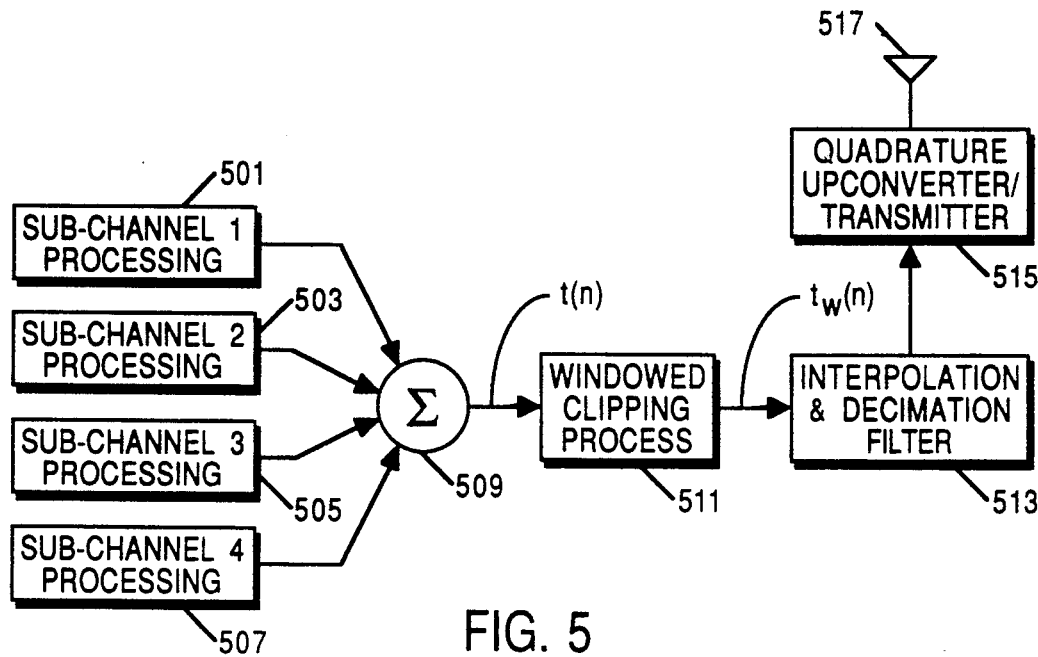
FIG. 5 is a block diagram of a transmitter with windowed clipping in accordance with the invention.

A block diagram of a transmitter with windowed clipping is shown in FIG. 5. Although a Quad-16QAM signal is transmitted in the preferred embodiment, the windowed-clipping procedure will function successfully on other signal types. Outputs from four Quad-16QAM sub-channel processors 501, 503, 505, and 507 are combined in a summer 509. The signal t(n) is the complex-valued signal stream at the output of the Quad-16QAM transmit sub-channel summer 509. The signal t(n) is input to the windowed-clipping process block 511, which outputs a window-clipped signal $t_w(n)$ to an interpolation and decimation filter 513, the output of which is fed into a quadrature upconverter/transmitter 515 for transmission of the signal in a predetermined fashion, e.g., Quad-16QAM, through an antenna 517.

Figure 6:
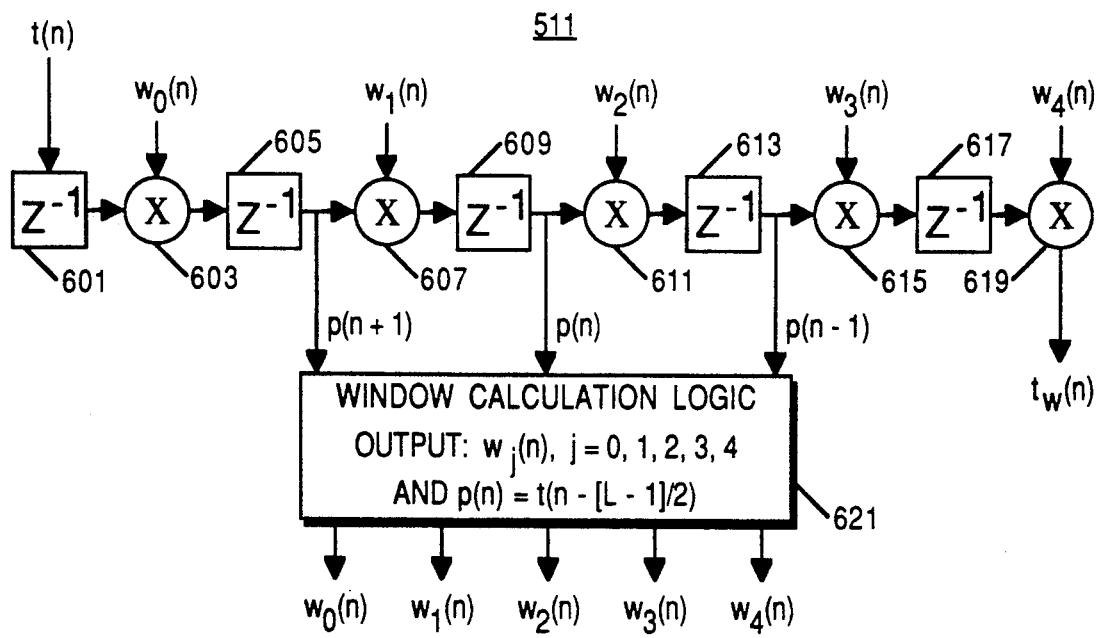
FIG. 6 is a block diagram showing a windowed clipping algorithm in accordance with the invention.

A block diagram showing a windowed-clipping algorithm is shown in FIG. 6. Although a window will typically be of length 9, 11, or 13, a length L=5 window is shown to minimize complexity of the drawings, where a length N window means that there are N stages of delay and N samples that are modified by the windowed-clipping process. The windowed-clipping algorithm is triggered by a local maximum sample value that exceeds Tclp. The three center elements of the delay line, p(n), p(n−1), and p(n+1), are used to check for algorithm triggering, where p(n)=t(n−[L−1]/2), which is a complex quantity. If $|p(n)|^2$ is less than Tclp, then no further logic is required, i.e., no clipping is necessary.

The input signal to the windowed-clipping process in t(n). The first stage of the process is a first one-sample delay stage 601. The output of this first delay 601 is combined with $w_0(n)$ in a first multiplier 603. The output of the first multiplier 603 is input to a second one-sample delay stage 605. The output of the second delay 605 is designated p(n+1), and is input to a second multiplier 607 and a window calculation logic block 621. The window calculation logic block 621 determines the values of the attenuating window, $w_0(n)$, $w_1(n)$, ..., $w_{L-1}(n)$, based on triggers and calculations described below. The sample p(n+1) is multiplied with $w_1(n)$ by the second multiplier 607. The output of the second multiplier 607 is input to a third one-sample delay stage 609. The output of the third delay 609 is designated p(n), because it represents the center sample of the widow which is used to center the attenuating window at a local maximum, and is input to a third multiplier 611 and the window calculation logic block 621. The sample p(n) is multiplied with $w_2(n)$ by the third multiplier 611. The output of the third multiplier 611 is input to a fourth one-sample delay stage 613. The output of the fourth delay 613 is designated p(n−1), and is input to a fourth multiplier 615 and the window calculation logic block 621. The sample p(n−1) is multiplied with $w_3(n)$ by the fourth multiplier 615. The output of the four multiplier 615 is input to a fifth one-sample delay stage 617. The output of this fifth delay 617 is combined with $w_4(n)$ in a fifth multiplier 619. The default values of the attenuating window, $w_0(n)$, $w_1(n)$, ..., $w_{L-1}(n)$, are ones, such that when the windowed-clipping algorithm is not triggered, the input signal samples pass through the windowed-clipping process 511 unaltered except for the delays. Thus, the multipliers 603, 607, 611, 615, and 619 apply the attenuating window to the input signal t(n) resulting in the output signal $t_w(n)$, which is at or below Tclp.

There are two modes of operation of the windowed-clipping algorithm, variable and constant. If $|p(n)|^2$ is greater than Tclp, but less than Tsat (criterion 1), and is determined to be a local maximum (criterion 2), a variable window calculation is triggered. Thus, the two conditions that trigger a variable window calculation are:

1) Tsat $< |p(n)|^2 <$ Tclp and
2) $|p(n)|^2 \geq |p(n-1)|^2$ and $|p(n)|^2 \geq |p(n+1)|^2$.

The equation that defines a variable window is:

$$w_j(n) = 1 + (c - 1)h_j$$

where $c = \sqrt{Tclp}/|p(n)|$ and $j = 0, 1, \ldots, L - 1$.

A length L Hanning window, where L is odd, is defined as:

$$h_j = [1 - \cos(2\pi j/(L-1))]/2 \text{ for } j = 0, 1, \ldots, L-1.$$

If $|p(n)|^2$ is greater than Test (criterion 1) and is also determined to be a local maximum (criterion 2) then constant windowed clipping occurs. Thus, the two conditions that trigger a constant window calculation are:

1) $|p(n)|^2 \geq$ Tsat and
2) $|p(n)|^2 \geq |p(n-1)|^2$ and $|p(n)|^2 \geq |p(n+1)|^2$.

Thus, a constant window is defined as $$w_j(n) = 1 + (c - 1)h_j$$

where $c = \sqrt{Tclp/Tsat}$ for $j = 0, 1, \ldots, L - 1$.

In the preferred embodiment, the windowed-clipping process 511 is performed in a Digital Signal Processor (DSP), such as a DSP56000 available from Motorola, Inc. The sub-channel processors 501, 503, 505, and 507, summer 509, and interpolation and decimation filter 513 are also performed by a DSP, as is known in the art.

When $|p(n)|^2$ is a local maximum, the windowed-clipping algorithm is triggered. Alternatively, the algorithm may be triggered simply when $|p(n)|^2$ is a grater than Tclp, resulting in a different type of low-splatter PAR reduction than with the previously described triggering. A variable window calculation is performed with this alternative form of triggering.

Although $w_j(n)$ for j=0, 1, ..., L−1 is an inverted Hanning window in the preferred embodiment, there are many other windows that will be successful when used in the windowed-clipping algorithm, such as a Hamming window or a Kaiser window.

Windowed clipping provides a less abrupt clipping operation than hard clipping, while affecting fewer input samples than soft clipping, resulting in a smoother clipping operation that splatters less energy out of al allocated frequency band. When Tsat is set to a level less than the absolute maximum peak level, both constant windowed clipping and variable windowed clipping occurs, further reducing the severity of the clipping, and communications on adjacent channels are subject to less interference.

What is claimed is:

1. A method of low-splatter peak-to-average reduction for a linear communication system, comprising the steps of:
   determining a local maximum of an input signal that is above a predetermined threshold;
   centered an attenuating window at said local maximum; and
   applying said attenuating window to said input signal.

2. The method of claim 1, wherein said attenuating window is an inverted Hanning window.

3. An apparatus for low-splatter peak-to-average reduction for a linear communication system, comprising:
   means for determining a local maximum of an input signal that is above a predetermined threshold;
   means for centering an attenuating window at said local maximum; and
   means for applying said attenuating window to said input signal.

4. The apparatus of claim 1, wherein said attenuating window is an inverted Hanning window.

5. A transmitter with an apparatus for low-splatter peak-to-average reduction for a linear modulation communication system, comprising:
   means for determining a local maximum of an input signal that is above a predetermined threshold;
   means for centering an attenuating window at said local maximum;
   means for applying said attenuating window to said input signal producing an attenuated input signal; and means, operatively coupled to said means for applying, for transmitting said attenuated input signal in a predetermined fashion in the linear modulation communication system.

6. The transmitter of claim 5, wherein said attenuating window is an inverted Hanning window.

7. An apparatus for windowed clipping of a signal comprised of samples in a linear communication system, comprising:
   means for delaying the signal by a predetermined number of samples;

means, coupled to said means for delaying, for triggering computation of windowed-clipping values;

means, coupled to said means for triggering, for computing said windowed-clipping values; and means, coupled to said means for delaying, for combining said windowed-clipping values with said delayed signal.

8. The apparatus of claim 7, wherein said computing means further comprises means for calculating an attenuating window using an inverted Hanning window.

9. A method of windowed clipping of a signal comprised of samples in a linear communication system, comprising the steps of:

delaying the signal by a predetermined number of samples;

triggering computation of windowed-clipping values;

computing said windowed-clipping values; and combining said windowed-clipping values with said delayed signal.

10. The method of claim 9, wherein said computing step further comprises the step of calculating an attenuating window using an inverted Hanning window.

11. A method of low-splatter peak-to-average reduction for a signal in a linear communication system, comprising the steps of:

determining magnitude of the signal;

delaying the signal when the magnitude of the signal is below a first threshold;

delaying and variably clipping the signal when the magnitude of the signal is above said first threshold and below a second threshold; and delaying and constantly clipping the signal when the magnitude of the signal is above said second threshold.

12. The method of claim 11, wherein the step of variably clipping further comprises the step of applying an inverted Hanning window.

13. The method of claim 11, wherein the step of constantly clipping further comprises the step of applying an inverted Hanning window.

14. A method of low-splatter peak-to-average reduction for a linear communication system, comprising the steps of:

determining that a sample of an input signal is above a predetermined threshold;

centering an attenuating window at said sample; and applying said attenuating window to said input signal.

15. The method of claim 14, wherein said attenuating window is an inverted Hanning window.

* * * * *